United States Patent
Nagai et al.

(10) Patent No.: US 10,115,598 B2
(45) Date of Patent: Oct. 30, 2018

(54) SUBSTRATE HOLDER, A METHOD FOR HOLDING A SUBSTRATE WITH A SUBSTRATE HOLDER, AND A PLATING APPARATUS

(71) Applicant: EBARA CORPORATION, Tokyo (JP)

(72) Inventors: Mizuki Nagai, Tokyo (JP); Masashi Shimoyama, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 224 days.

(21) Appl. No.: 14/998,239

(22) Filed: Dec. 23, 2015

(65) Prior Publication Data

US 2016/0194780 A1    Jul. 7, 2016

(30) Foreign Application Priority Data

Dec. 26, 2014    (JP) ................. 2014-265211

(51) Int. Cl.
| | | |
|---|---|---|
| C25D 17/00 | (2006.01) | |
| C25D 17/06 | (2006.01) | |
| C25D 7/12 | (2006.01) | |
| H01L 21/288 | (2006.01) | |

(52) U.S. Cl.
CPC .......... H01L 21/2885 (2013.01); C25D 7/123 (2013.01); C25D 17/001 (2013.01); C25D 17/008 (2013.01); C25D 17/06 (2013.01)

(58) Field of Classification Search
None
See application file for complete search history.

(56) References Cited

U.S. PATENT DOCUMENTS

| | | | | |
|---|---|---|---|---|
| 3,986,284 A | * | 10/1976 | Plantinga | .......... G09F 7/18 |
| | | | | 248/125.1 |
| 4,534,832 A | * | 8/1985 | Doiron, Jr. | .......... C25D 5/022 |
| | | | | 204/273 |
| 6,159,354 A | | 12/2000 | Contolini et al. | |

(Continued)

FOREIGN PATENT DOCUMENTS

| | | |
|---|---|---|
| JP | 10-163212 A | 6/1998 |
| JP | 11-193499 A | 7/1999 |

(Continued)

OTHER PUBLICATIONS

Machine translation of Yoshioka et al (JP 11-193499), obtained from http://worldwide.espacenet.com on Oct. 2, 2017 (Year: 1999).*

*Primary Examiner* — Harry D Wilkins, III
(74) *Attorney, Agent, or Firm* — Baker & Hostetler LLP

(57) ABSTRACT

To suppress thicknesses of a plating film of dies adjacent to a portion in which patterns are not formed on a resist, and improve uniformity of a plated metal layer thickness in a substrate surface. A substrate holder according to the present invention has: a holding surface 57 for holding a substrate; a second holding member 60 configured to have an opening part 63 for exposing the holding surface 57, and to press the substrate placed on the holding surface 57 against the holding surface 57 to thereby hold the substrate; and a shielding plate 65 configured to protrude to an inside of the opening part 63 of the second holding member 60 in a radial direction and to shield a part of the holding surface 57. The shielding plate 65 is configured to be movable along the opening part 63.

4 Claims, 12 Drawing Sheets

(56) References Cited

U.S. PATENT DOCUMENTS

| | | | | |
|---|---|---|---|---|
| 6,268,656 | B1* | 7/2001 | Leibovitz | H01L 24/11 257/737 |
| 6,402,923 | B1* | 6/2002 | Mayer | C25D 17/12 204/224 R |
| 7,247,223 | B2* | 7/2007 | McHugh | C25D 5/18 204/275.1 |
| 7,857,958 | B2* | 12/2010 | McHugh | C25D 5/18 205/157 |
| 9,624,596 | B2* | 4/2017 | Yoshioka | C25D 17/001 |
| 2003/0079995 | A1* | 5/2003 | Contolini | C25D 17/008 205/118 |
| 2004/0256222 | A1* | 12/2004 | Griego | B23K 35/0244 204/280 |
| 2004/0262150 | A1* | 12/2004 | Yajima | C25D 21/12 204/224 R |
| 2005/0000817 | A1 | 1/2005 | McHugh et al. | |
| 2009/0139871 | A1* | 6/2009 | Saito | C25D 21/10 205/148 |
| 2012/0305404 | A1 | 12/2012 | Keigler | |
| 2016/0194780 | A1* | 7/2016 | Nagai | C25D 17/008 204/242 |

FOREIGN PATENT DOCUMENTS

| | | |
|---|---|---|
| JP | 11-246999 A | 9/1999 |
| JP | 2004-225129 A | 8/2004 |
| JP | 2009-155726 A | 7/2009 |

\* cited by examiner

SUBSTRATE HOLDER, A METHOD FOR HOLDING A SUBSTRATE WITH A SUBSTRATE HOLDER, AND A PLATING APPARATUS

TECHNICAL FIELD

The present invention relates to a substrate holder that holds a substrate, including but not limited to a semiconductor wafer, a method for holding the substrate with the substrate holder, and a apparatus that performs plating treatment on the substrate.

BACKGROUND ART

Conventionally, it has been performed to form a wiring in a fine wiring groove, a hole, or a resist opening part provided on a surface of a substrate such as semiconductor wafer, and to form a bump, i.e. a projected electrode, which is configured to electrically connected to parts such as an electrode packaged on the surface of a substrate such as semiconductor wafer. In general, as a method for forming the wiring and the bump, an electrolytic plating method (in other words, electroplating method), a deposition method, a printing method, a ball bump method and other methods have been known, the electroplating method in which miniaturization can be made and in which performance is comparatively stable has been increasingly used for the purpose of forming the wiring and the bump on the substrate to be used in manufacturing a semiconductor chip with the increased number of I/O and the narrower pitch.

Concave portions are formed in a substrate, on which a plated metal layer is formed by the electrolytic plating method, by forming patterns on a resist provided on a surface of the substrate. The concave portions are arrayed on the substrate in a grid shape, and one of the grids is called a die. Since the dies are formed on the circular substrate in the grid shape, they are not evenly arrayed. Namely, a region in which the dies are not formed is present near an outer periphery of the substrate. In addition, when an identification number for identifying the substrate has been printed on the substrate, the patterns, or the dies, are not formed on a portion on which the identification number has been printed, either (i.e., the portion on which the identification number has been printed is covered with the resist).

When metal is deposited in the concave portions in the patterns of the resist by electrolytic plating to thereby form bumps etc., the bumps are not formed at a portion on the substrate completely covered with the resist, and thus metal ions corresponding to the portion completely covered with the resist gather in the dies adjacent to the portion in which the patterns are not formed on the resist (the portion completely covered with the resist). For this reason, since the metal ions in a plating liquid gather more easily in the dies adjacent to the portion in which the patterns are not formed on the resist compared with in the other dies (for example, a die located in a center of the substrate), bump heights of the dies are higher than those of the other dies. Hereby, since uniformity of a metal layer thickness plated on a substrate surface deteriorates, the number of superior dies is decreased, and the substrate itself may become scrap depending on a case. Accordingly, it has been required that the bump heights and wiring thicknesses of the dies adjacent to the portion in which the patterns are not formed on the resist are suppressed.

By the way, conventionally, it has been known to provide a shielding plate near an energization pin of a plating jig in order to suppress a plated metal layer thickness of a portion at which the energization pin for energizing a wafer is arranged from becoming thick in forming a plated layer on the wafer (refer to Patent Literature 1).

CITATION LIST

Patent Literature

Patent Literature 1: Japanese Patent Laid-Open No. 11-193499

SUMMARY OF INVENTION

Technical Problem

However, the invention described in Japanese Patent Laid-Open No. 11-193499 suppresses the metal layer thickness of the portion at which the energization pin whose position has been fixed is arranged. In other words, the invention described in Japanese Patent Laid-Open No. 11-193499 does not suppress bump heights and wiring thicknesses in a substrate surface, in a case where a position of the portion in which patterns are not formed on a resist, i.e., a position of the portion in which the bump heights and the wiring thicknesses are large, is changed, depending on a type of the substrate or a direction of the substrate arranged at the plating jig.

The present invention has been made in view of the above-described problem, and an object thereof is to suppress thicknesses of a plating film of dies adjacent to a portion in which patterns are not formed on a resist, and to improve the uniformity of a plated metal layer thickness on a substrate.

Solution to Problem

One mode of a substrate holder of the present invention is a substrate holder for holding a substrate, and the substrate holder has: a substrate holding surface for placing and holding the substrate; a substrate holding part configured to have an edge that forms an opening part for exposing the substrate placed on the substrate holding surface, and to press the substrate against the substrate holding surface to thereby hold the substrate; and a shielding part configured to be arranged at the substrate holding part, protrude to an inside of the opening part of the substrate holding part in a radial direction, and to shield a part of the substrate, in which the shielding part is configured to be movable along the edge.

In one mode of the substrate holder of the present invention, the shielding part is configured to be movable in the radial direction of the opening part.

In one mode of the substrate holder of the present invention, the shielding part has a protruding part that protrudes toward the substrate holding surface.

In one mode of the substrate holder of the present invention, the protruding part has a tapered surface in a surface on the inside in the radial direction of the opening part, a thickness of the tapered surface becoming smaller toward the substrate holding surface.

In one mode of the substrate holder of the present invention, the substrate holding part has a groove formed along the edge of the opening part, the shielding part has an engagement part that engages with the groove, and the shielding part is configured to be movable along the edge of the opening part by the engagement part sliding along the groove.

One mode of a plating apparatus of the present invention is a plating apparatus including the above-described substrate holder, and the plating apparatus has a shielding part moving mechanism for moving the shielding part along the edge of the opening part.

One mode of a method for holding a substrate by a substrate holder of the present invention has the steps of: placing the substrate between a substrate holding surface and a substrate holding part of the substrate holder, and pressing the substrate against the substrate holding surface by the substrate holding part while exposing the substrate to thereby hold the substrate; and moving along an edge of an opening part a shielding part that protrudes to an inside of an opening part of the substrate holding part in a radial direction and shields a part of the substrate placed on the substrate holding surface.

One mode of a plating apparatus of the present invention is a plating apparatus that plates a substrate, and the plating apparatus includes: a plating bath configured to house the substrate and an anode; and an intermediate mask arranged between the substrate and the anode, in which the intermediate mask has a plurality of edge parts that form an opening through which an electric field from the anode to the substrate is made to pass, and in which the plating apparatus has a drive mechanism that moves a position of an inner part of each of the edge parts in a radial direction of the opening.

One mode of a plating apparatus of the present invention is a plating apparatus that plates a substrate, and the plating apparatus includes: a plating bath configured to house the substrate and an anode; and an intermediate mask arranged between the substrate and the anode, in which the intermediate mask has a plurality of edge parts that form an opening through which an electric field from the anode to the substrate is made to pass, and in which the plating apparatus has a drive mechanism that moves each of the edge parts in a direction toward the substrate.

Advantageous Effects of Invention

According to the present invention, thicknesses of a plated metal layer of dies adjacent to a portion in which patterns are not formed on a resist can be suppressed, and the uniformity of the plated metal layer thickness on a substrate can be improved.

DESCRIPTION OF EMBODIMENTS

Figure 1:
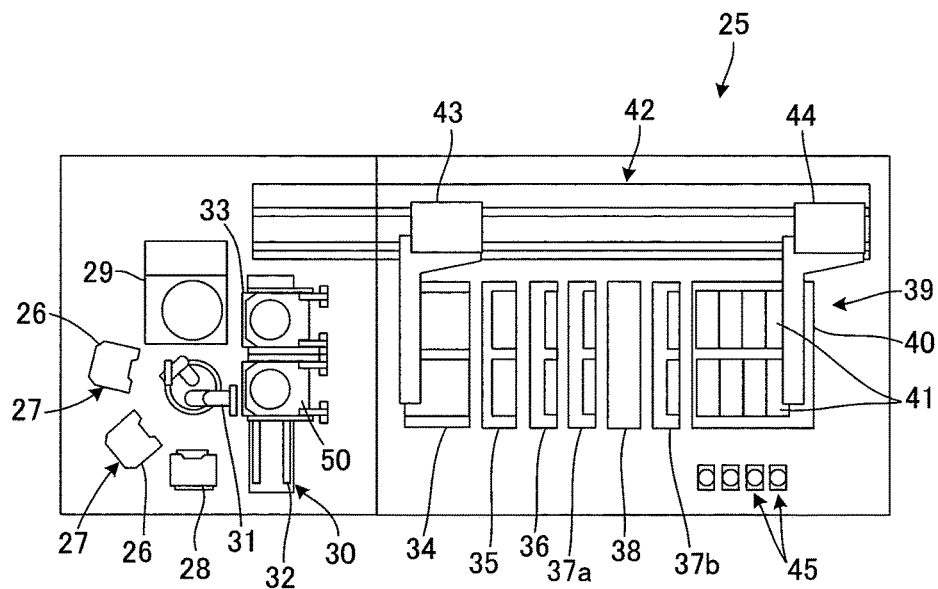
FIG. 1 is an overall arrangement view of a plating apparatus including a substrate holder according to the embodiment.

Hereinafter, an embodiment of the present invention will be explained with reference to drawings. In the drawings explained below, the same symbols are attached to the same or corresponding components, and overlapping explanation thereof is omitted.

FIG. 1 is an overall arrangement view of a plating apparatus including a substrate holder according to the embodiment. As shown in FIG. 1, a plating apparatus 25 includes: two cassette tables 27 each having a cassette 26 mounted thereon, the cassette 26 storing a substrate, such as a semiconductor wafer; an aligner 28 that aligns positions of an orientation flat and a notch of the substrate in a predetermined direction; a substrate attaching/detaching part 30 that attaches the substrate to a placed substrate holder 50 and detaches the substrate from the placed substrate holder 50; and a spin dryer 29 that rotates the substrate after plating treatment at a high speed to thereby dry it. A plating apparatus 25 further includes a transportation robot in a center of these units, such as a substrate transporting device 31, which transports the substrate among the above-described units.

The substrate attaching/detaching part 30 includes a flat plate-shaped placement plate 33 that is slidable in a horizontal direction along a rail 32. The substrate transporting device 31 performs delivery of the substrate with one of the two substrate holders 50 placed on the placement plate 33 in a horizontal state. After that, the substrate transporting device 31 slides the placement plate 33 in the horizontal direction, and performs delivery of the substrate with the other substrate holder 50.

In addition, in the plating apparatus 25, there are arranged: a stocker 34 for storing and temporarily placing the substrate holders 50; a pre-wet bath 35 for soaking the substrate in pure water; a pre-soak bath 36 that removes by etching an oxide film of a surface of a seed layer formed on a surface of the substrate; a first washing bath 37a that washes the surface of the substrate with the pure water; a blow bath 38 that drains the substrate after cleaning; a second washing bath 37b; and a plating part 39.

The plating part 39 includes an overflow bath 40, and a plurality of copper plating units 41 stored inside the overflow bath 40. Each copper plating unit 41 stores the substrate holder 50 holding the substrate inside it, and performs plating treatment, such as copper plating. Note that although the copper plating is explained in this example, the similar plating apparatus 25 can be used also in plating of nickel, solder, silver, gold, etc.

Further, the plating apparatus 25 further includes a substrate holder transporting device 42 that transports the substrate holder 50 together with the substrate. The substrate holder transporting device 42, for example, employs a linear motor system, and is located on a side of the substrate attaching/detaching part 30 and the above-described each bath. The substrate holder transporting device 42 has: a first transporter 43 that transports the substrate between the substrate attaching/detaching part 30 and the stocker 34; and a second transporter 44 that transports the substrate among the stocker 34, the pre-wet bath 35, the pre-soak bath 36, the washing baths 37a and 37b, the blow bath 38, and the plating part 39. Note that the substrate holder transporting device 42 may include only the first transporter 43 without including the second transporter 44.

In addition, on a side of the overflow bath 40 of the substrate holder transporting device 42, there is arranged a paddle driving device 46 that drives a paddle (not shown) that is located inside each copper plating unit 41 and stirs a plating liquid.

<Substrate Holder>

Figure 2:
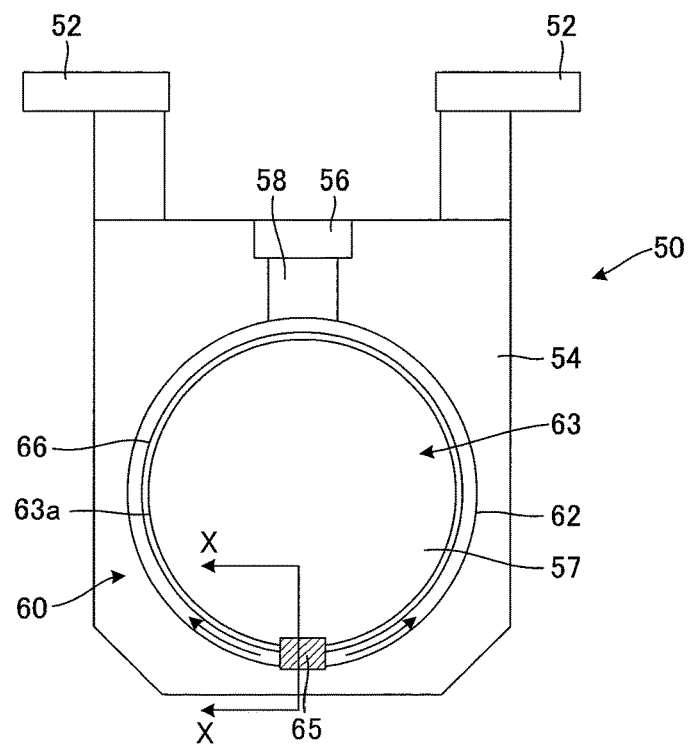
FIG. 2 is a schematic elevational view of the substrate holder according to the embodiment used in a plating apparatus.
Figure 3:
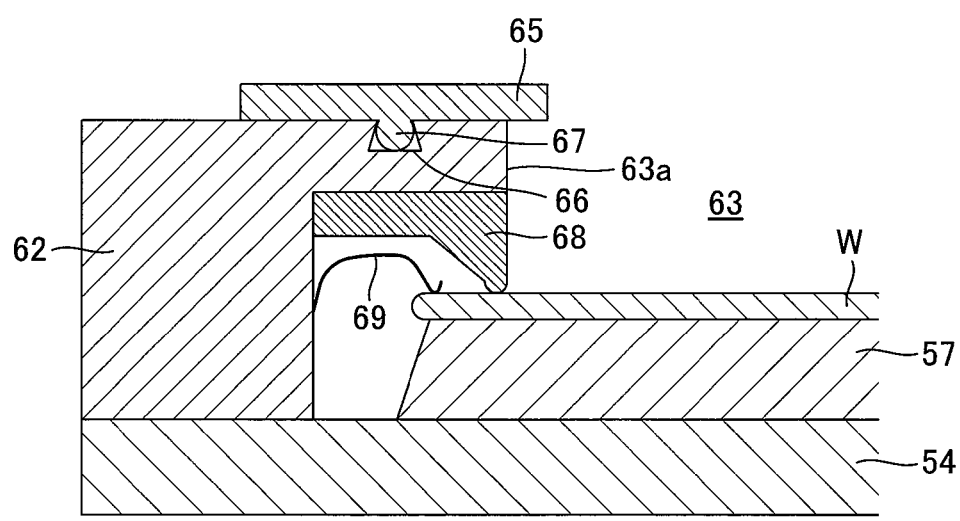
FIG. 3 is a cross-sectional view in an XX cross section of the substrate holder of FIG. 2.

FIG. 2 is a schematic elevational view of the substrate holder 50 according to the embodiment used in the plating apparatus 25 shown in FIG. 1, and FIG. 3 is a cross-sectional view in an XX cross section of the substrate holder shown in FIG. 2. The substrate holder 50, as shown in FIG. 2, for example, has: a rectangular flat plate-shaped first holding member 54 made of vinyl chloride; and a second holding member 60 (a substrate holding part) openably attached to the first holding member 54 with a hinge 56. A holding surface 57 (a substrate holding surface) for placing and holding the substrate is provided substantially in a center of the first holding member 54 of the substrate holder 50. The second holding member 60 has an edge 63a that forms an opening part 63 for exposing the substrate placed on the holding surface 57.

A pair of substantially T-shaped hands 52 that serves as support parts when the substrate holder 50 is transported, and hung and supported is coupled to an upper end of the first holding member 54 of the substrate holder 50. The substrate holder 50 is vertically hung and supported by hooking the hands 52 on an upper surface of a peripheral wall of the stocker 34 in the stocker 34 shown in FIG. 1. In addition, the hands 52 of the hung and supported substrate holder 50 are gripped by the first transporter 43 or the second transporter 44 of the substrate holder transporting device 42, and then the substrate holder 50 is transported. Note that also in the pre-wet bath 35, the pre-soak bath 36, the washing baths 37a and 37b, the blow bath 38, and the plating part 39, the substrate holder 50 is hung on and supported by peripheral walls of the baths through the hands 52.

The second holding member 60 includes a base 58 fixed to the hinge 56, and a ring-shaped seal holder 62 fixed to the base 58. When the substrate is held, first, the substrate is placed on the holding surface 57 of the first holding member 54 in a state where the second holding member 60 is opened, and the second holding member 60 is closed through the hinge 56. Subsequently, a not-shown ring-shaped pressing part is rotated clockwise, the pressing part is made to engage with a not-shown clamper etc., and the second holding member 60 is tightened to the first holding member 54 to then be locked. When the first holding member 54 and the second holding member 60 are locked, the second holding member 60 presses an outer periphery of the substrate placed on the holding surface 57 against the holding surface 57, and holds the substrate.

When holding of the substrate is released, the not-shown ring-shaped pressing part is rotated counterclockwise in a state where the first holding member 54 and the second holding member 60 are locked. Hereby, engagement of the not-shown pressing part and the not-shown clamper is released, and holding of the substrate is released.

In addition, as shown in FIG. 2, on the seal holder 62 of the second holding member 60, the substrate holder 50 has a shielding plate 65 (i.e., a shielding part) that protrudes to an inside of the opening part 63 in a radial direction, and that shields a part of the substrate placed on the holding surface 57. The shielding plate 65 is a substantially rectangular plate, and includes synthetic resin, such as vinyl chloride, resin, and VITON®. Note that a material of the shielding plate 65 is not limited to synthetic resin, and that other dielectrics can also be used.

A substrate W is placed on the holding surface 57 as shown in FIG. 3. An upper surface of the substrate W is pressed by a seal 68 held by the seal holder 62. Hereby, the substrate W is held by the substrate holder 50. A distance between an inner peripheral surface of the seal 68 and an outer edge (i.e., an end) of the substrate W is, for example, 1 to 3 mm. The substrate holder 50 has a power supply terminal 69 for supplying electric power to a conductive layer formed on a surface of the substrate W. The power supply terminal 69 comes into contact with an outer periphery of the substrate W to supply electric power to the substrate W in a space sealed by the seal 68.

As shown in FIGS. 2 and 3, the seal holder 62 has an annular groove 66 formed in an upper surface thereof along the edge 63a of the opening part 63. The groove 66 is located on the seal holder 62 so as to be a concentric circle of the substrate W. The shielding plate 65 has a projecting part 67 (i.e., an engagement part) that engages with the groove 66. The projected part 67 engages with the groove 66, and thereby the shielding plate 65 is fixed to an arbitrary position on the seal holder 62. In addition, the shielding plate 65 is configured to be movable along the edge 63a of the opening part 63 by the projected part 67 sliding along the groove 66. Accordingly, the shielding plate 65 is configured to be movable on the concentric circle of the substrate W. Note that although the one shielding plate 65 is provided at the substrate holder 50 shown in FIG. 2, the present invention is not limited to this, and two or more shielding plates 65 may be provided at the substrate holder 50.

The shielding plate 65 protrudes to the inside of the opening part 63 in the radial direction, and shields a part of the substrate W placed on the holding surface 57, whereby a part of an electric field applied to the substrate W in electrolytic plating is shielded. Hereby, in a portion of the substrate W covered with the shielding plate 65, a thickness of a plated metal layer to be formed becomes thinner compared with that of the other portion. Note that the shielding plate 65 is preferably configured to protrude to the inside of the opening part 63 in the radial direction in a range not less than 0.5 mm and not more than 10 mm from an inner peripheral surface of the seal holder 62.

Figure 4:
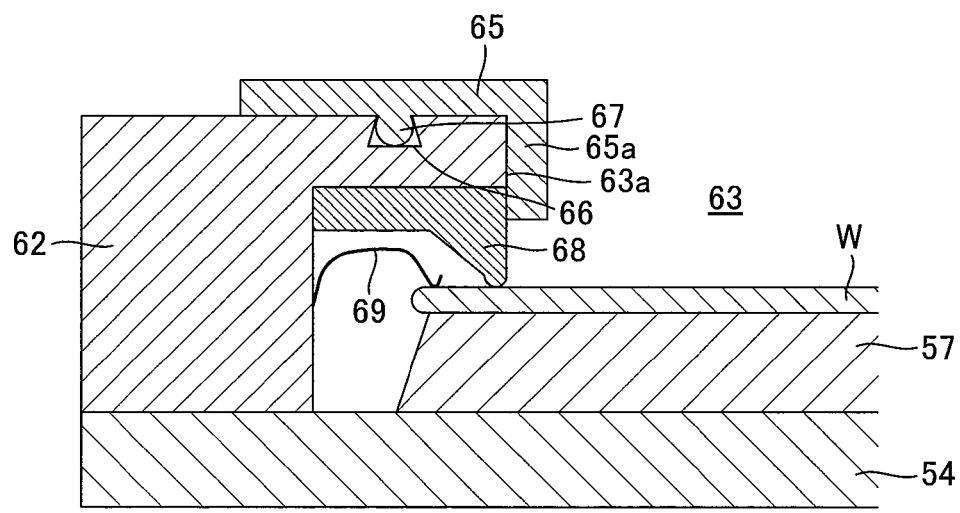
FIG. 4 is a cross-sectional view showing an example of the other mode of a shielding plate.
Figure 5:
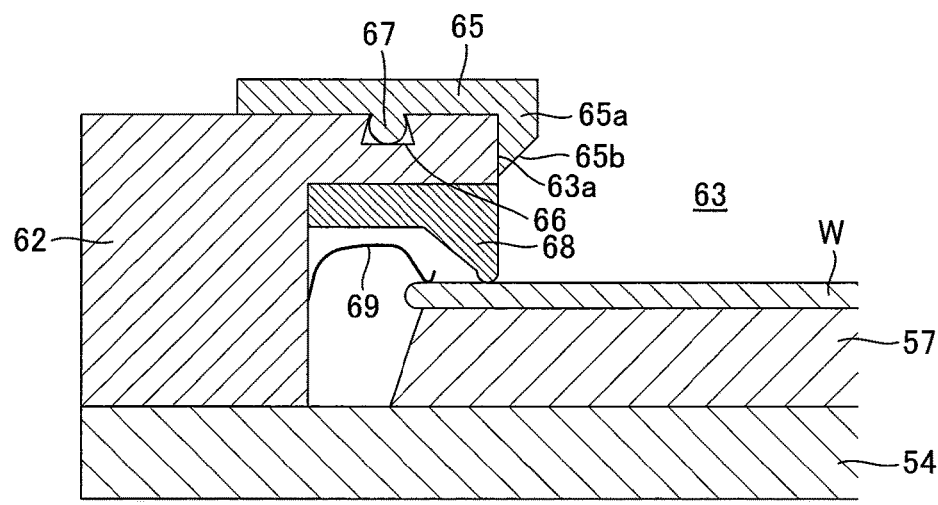
FIG. 5 is a cross-sectional view showing an example of the other mode of the shielding plate.
Figure 6:
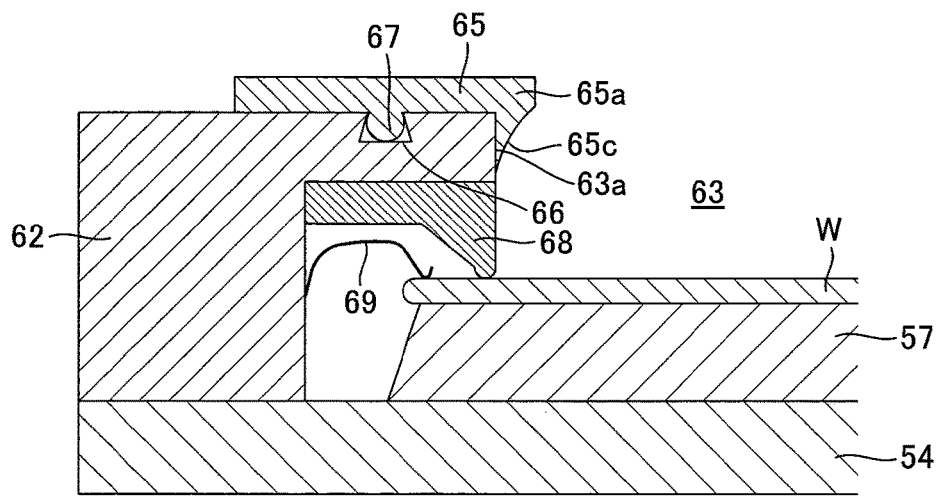
FIG. 6 is a cross-sectional view showing an example of the other mode of the shielding plate.

Next, there will be explained an example of the other mode of the shielding plate 65 provided at the substrate holder 50 according to the embodiment. FIGS. 4 to 6 are cross-sectional views showing the example of the other mode of the shielding plate 65. The shielding plate 65 shown in FIG. 4 has a protruding part 65a that protrudes to a holding surface 57 side of the opening part 63 of the seal holder 62. The protruding part 65a is a plate-shaped body provided at an end of the shielding plate 65. An outer peripheral surface of the protruding part 65a (in other words, a surface that faces inner peripheral surfaces of the seal holder 62 and the seal 68) is formed to be curved so as to coincide with shapes of the inner peripheral surfaces of the seal holder 62 and the seal 68. Since the protruding part 65a reduces a distance (i.e., an interval) between the substrate W placed on the holding surface 57 and the shielding plate 65, the thickness of the plating film formed on the portion of the substrate W covered with the shielding plate 65 can be more reduced.

The shielding plate 65 shown in FIG. 5 has the protruding part 65a that protrudes to the holding surface 57 side of the opening part 63 of the seal holder 62 similarly to the shielding plate 65 shown in FIG. 4. The protruding part 65a of the shielding plate 65 shown in FIG. 5 has a tapered surface 65b in a surface on the inside in the radial direction of the opening part 63, a thickness of the tapered surface 65b becoming smaller toward the holding surface 57. The protruding part 65a has the tapered surface 65b as described above, and thereby bubbles can be suppressed from remaining in a boundary portion of the protruding part 65a, and the seal holder 62 and the seal 68. In addition, since a plating liquid can also be suppressed from remaining in the boundary portion, cleaning of the substrate holder 50 becomes easy.

The shielding plate 65 shown in FIG. 6 has the protruding part 65a that protrudes to the holding surface 57 side of the opening part 63 of the seal holder 62 similarly to the shielding plates 65 shown in FIGS. 4 and 5. The protruding part 65a of the shielding plate 65 shown in FIG. 6 has a curved tapered surface 65c in a surface on the inside in the radial direction of the opening part 63, a thickness of the curved tapered surface 65c becoming smaller toward the holding surface 57. The protruding part 65a has the curved tapered surface 65c as described above, and thereby bubbles can be suppressed from remaining in a boundary portion of the protruding part 65a, and the seal holder 62 and the seal 68. In addition, since a plating liquid can also be suppressed from remaining in the boundary portion, cleaning of the substrate holder 50 becomes easy.

Figure 7:
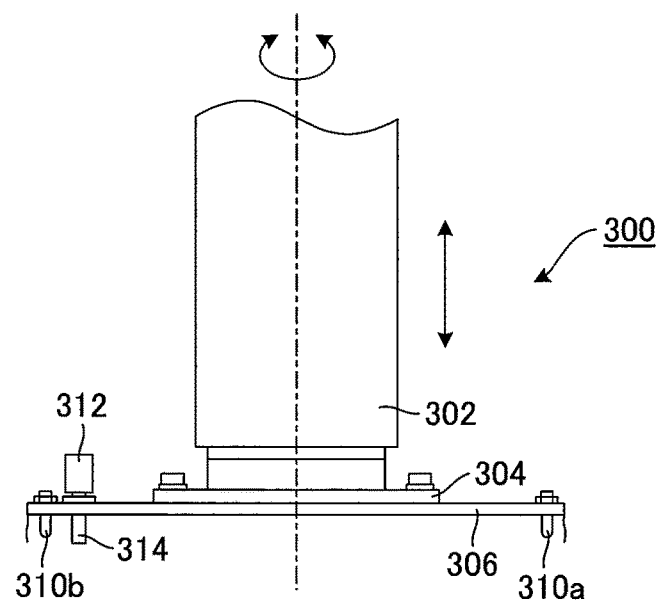
FIG. 7 is a schematic side view of a substrate holder attaching/detaching device.

Next, a device and a method for moving the shielding plate 65 along the opening part 63 will be explained. FIG. 7 is a schematic side view of a substrate holder attaching/detaching device. A substrate holder attaching/detaching device 300 (a shielding part moving mechanism) is provided at the substrate attaching/detaching part 30 shown in FIG. 1, and it is the device for locking the second holding member 60 of the substrate holder 50 mainly shown in FIG. 2 to the first holding member 54 to thereby make the substrate holder 50 hold the substrate.

The substrate holder attaching/detaching device 300 has: a shaft 302 configured to be movable and rotatable in an axial direction; a disk 304 fixed to the shaft 302; and a disk 306 with a larger diameter than the disk 304 fixed to a lower surface of the disk 304. A plurality of (for example, two is shown in FIG. 7) holder lock pins 310a and 310b for rotating a not-shown ring-shaped pressing part of the substrate holder 50 are provided at the lower surface of the disk 304.

At the disk 304, there are provided: a shielding plate rotating pin 314 for moving the shielding plates 65 shown in FIGS. 2 to 6 along the edge 63a of the opening part 63; and an air cylinder 312 for expanding and contracting the shielding plate rotating pin 314. The shielding plate rotating pin 314 extends penetrating the disk 304 from an upper surface side toward a lower surface side of the disk 304. When the shielding plate 65 is moved, the air cylinder 312 makes the shielding plate rotating pin 314 protrude downwardly from the lower surface of the disk 304 as shown in FIG. 7. Meanwhile, when the holder lock pins 310a and 310b make the substrate holder 50 lock, the air cylinder 312 stores the shielding plate rotating pin 314 inside a cylinder so that the shielding plate rotating pin 314 does not interfere with locking work.

When the substrate holder 50 shown in FIG. 2 is made to hold the substrate W, first, the substrate holder 50 is arranged under the substrate holder attaching/detaching device 300, and the substrate W is placed on the holding surface 57. Subsequently, the outer periphery of the substrate W is pressed by the seal 68 (refer to FIG. 4 etc.) of the second holding member 60, while the substrate W placed on the holding surface 57 is exposed from the opening part 63 of the second holding member 60. The substrate holder attaching/detaching device 300 drives the shaft 302 downwardly, and, for example, inserts the holder lock pins 310a and 310b in a concave portion etc. formed in an upper surface of the not-shown ring-shaped pressing part of the substrate holder 50. The shaft 302 of the substrate holder attaching/detaching device 300 rotates in this state, whereby the not-shown pressing part is made to engage with the not-shown clamper etc., and the second holding member 60 is tightened to the first holding member 54 to then be locked. Note that at this time, the shielding plate rotating pin 314 has been stored inside the cylinder of the air cylinder 312.

When the shielding plates 65 shown in FIGS. 2 to 6 are moved along the opening part 63 of the substrate holder 50, first, the substrate holder 50 is arranged under the substrate holder attaching/detaching device 300, and the air cylinder 312 makes the shielding plate rotating pin 314 protrude downwardly from a lower surface of the disk 306. Subsequently, the substrate holder attaching/detaching device 300 drives the shaft 302 downwardly, and, for example, inserts the shielding plate rotating pin 314 in a not-shown concave portion etc. formed in an upper surface of the shielding plate 65. The shaft 302 of the substrate holder attaching/detaching device 300 rotates in this state, and thereby the shielding plate 65 moves along the edge 63a of the opening part 63, thus enabling the shielding plate 65 to move to a desired position.

Note that although the substrate holder attaching/detaching device 300 shown in FIG. 7 is configured to have the one shielding plate rotating pin 314, the substrate holder attaching/detaching device 300 may be configured to have the same number of shielding plate rotating pins 314 as the number of shielding plates 65 in a case where the substrate holder 50 shown in FIG. 2 has the plurality of shielding plates 65.

Figure 8:
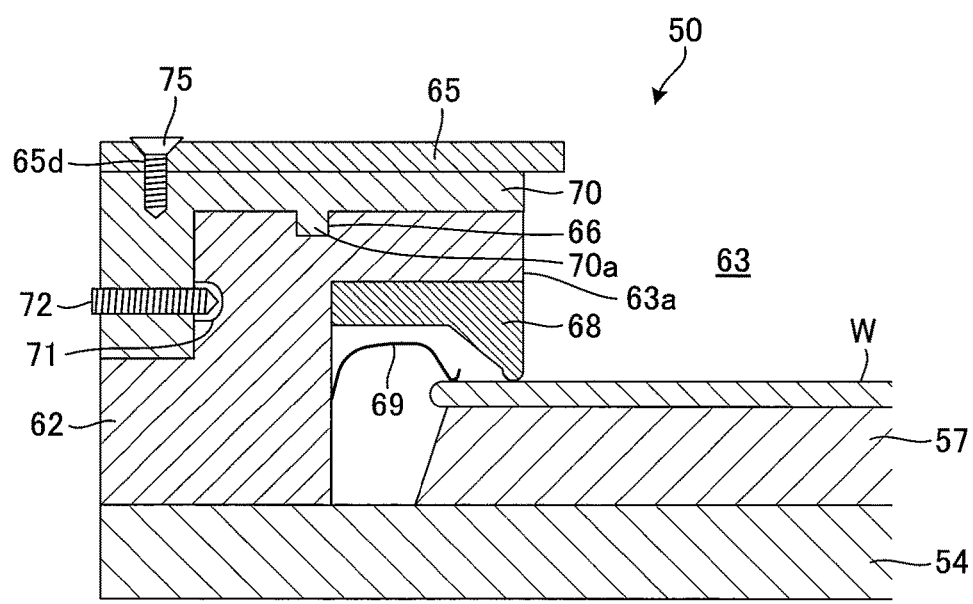
FIG. 8 is a cross-sectional view showing an example of a still other mode of the shielding plate.
Figure 9:
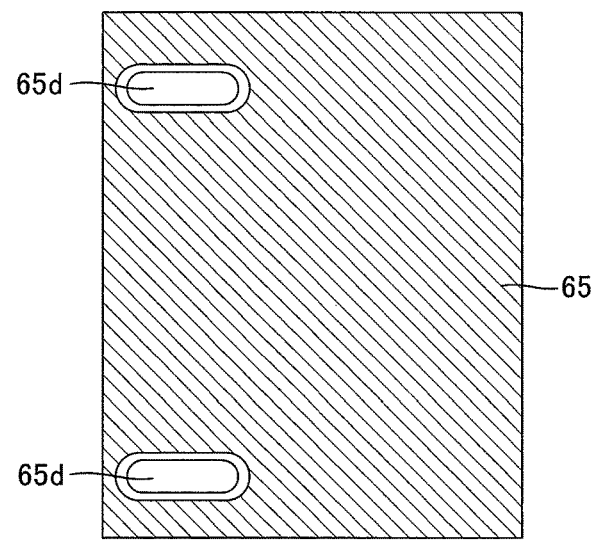
FIG. 9 is a plan view of the shielding plate of FIG. 8.

Next, there will be explained an example of a still other mode of the shielding plate 65 provided at the substrate holder 50 according to the embodiment. FIG. 8 is a cross-sectional view showing the example of the still other mode of the shielding plate 65, and FIG. 9 is a plan view of the shielding plate 65 of FIG. 8. While the shielding plates 65 shown in FIGS. 2 to 6 are configured to be movable only in a peripheral direction along the edge 63a of the opening part 63 of the seal holder 62, the shielding plate 65 shown in FIGS. 8 and 9 is configured to be movable also in a radial direction of the opening part 63 of the seal holder 62.

As shown in FIG. 8, the shielding plate 65 is a plate-shaped body that protrudes to an inside of the opening part 63 in the radial direction, and covers (shields) a part of the holding surface 57. As shown in FIG. 9, the shielding plate 65 has one or more (for example, two is shown in FIG. 2) elongated holes 65d, and the elongated hole 65d is formed so that a longitudinal direction thereof coincides with the radial direction of the opening part 63.

As shown in FIG. 8, a peripheral-direction moving member 70 having an L-shaped cross section is attached to the seal holder 62. The shielding plate 65 is fixed to an upper surface of the peripheral-direction moving member 70 by fixing means 75, such as a screw, through the elongated hole 65d. The shielding plate 65 can move in the radial direction of the opening part 63 along the elongated hole 65d by loosening the fixing means 75. The shielding plate 65 is preferably fixed to the peripheral-direction moving member 70 so as to protrude to the inside of the opening part 63 in the radial direction in a range not less than 0.5 mm and not more than 10 mm from an inner peripheral surface of the seal holder 62.

The peripheral-direction moving member 70 has a projecting part 70a (i.e., an engagement part) that engages with the annular groove 66 formed in an upper surface of the seal holder 62. In addition, in this example, the seal holder 62 has a groove 71 provided along an outer peripheral surface thereof, and the peripheral-direction moving member 70 is fixed to the seal holder 62 by fixing means 72, such as a set screw whose tip is screwed into the groove 71. The peripheral-direction moving member 70 is configured to be movable along the edge 63a of the opening part 63 by the projecting part 70a sliding along the groove 66 in a state where the fixing means 72 is loosened. Accordingly, the shielding plate 65 is configured to be movable along the edge 63a of the opening part 63 together with the peripheral-direction moving member 70. In addition, the peripheral-direction moving member 70 is fixed to a predetermined position by fastening the fixing means 72, after being arranged at the predetermined position. Accordingly, the shielding plate 65 is included in a shielding member that can move in the radial direction of the opening part 63 together with the peripheral-direction moving member 70, and can move along the edge 63a of the opening part 63. Note that the shielding plate 65 may have the protruding part 65a shown in FIGS. 4 to 6 at a tip thereof.

As explained in the above, since the substrate holder 50 in the embodiment has the shielding plate 65 configured to be movable along the edge 63a of the opening part 63, the shielding plate 65 can be positioned near a portion (for example, dies adjacent to a portion in which patterns are not formed on a resist) on the substrate W in which a plated metal layer thickness is desired to be thin. Hereby, the thickness of the plated metal layer of the portion on the substrate W in which the plated metal layer thickness is desired to be thin can be suppressed, and eventually, in-surface uniformity of the plated metal layer thickness of the substrate W can be improved. Note that in the embodiment, the shielding plate 65 can be moved to an appropriate position by manually or by the substrate holder attaching/detaching device 300 for each substrate W to be treated. Meanwhile, a position of the shielding plate 65 in the peripheral direction is previously registered in a not-shown control device of the plating apparatus 25, whereby a position on the substrate W to be shielded is read by the aligner 28, and the substrate W can also be placed on the substrate holder 50 while the position on the substrate W to be shielded is aligned to the position of the shielding plate 65.

In addition, in the substrate holder 50 in the embodiment, since the shielding plate 65 is configured to be movable in the radial direction of the opening part 63, an area in which the shielding plate 65 covers (or shields) the substrate W placed on the holding surface 57 can be adjusted. For this reason, since a shielding amount of the electric field applied to the substrate W in electrolytic plating can be adjusted, a region on the substrate W in which the plated metal layer thickness is made thin can be adjusted, and the plated metal layer thickness can be appropriately adjusted according a type of the substrate W.

<Intermediate Mask>

Figure 10:
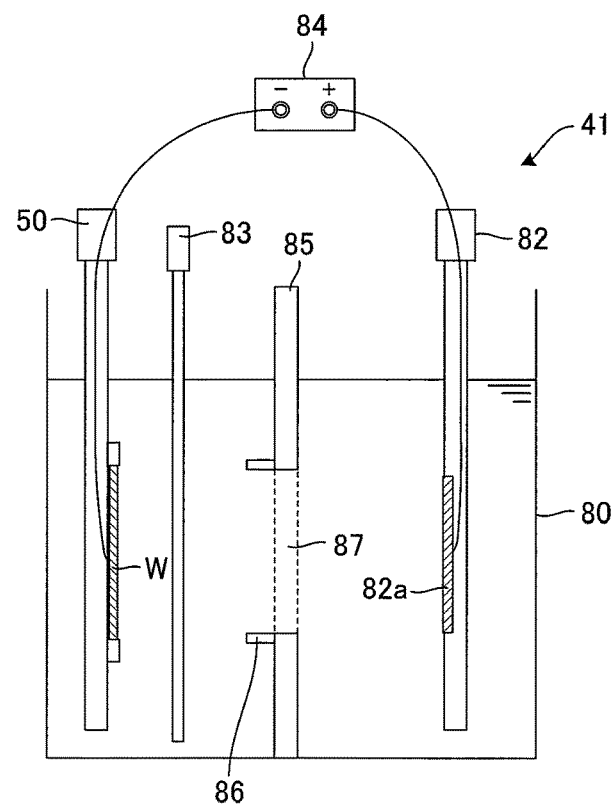
FIG. 10 is a schematic side cross-sectional view of a copper plating unit.
Figure 11:
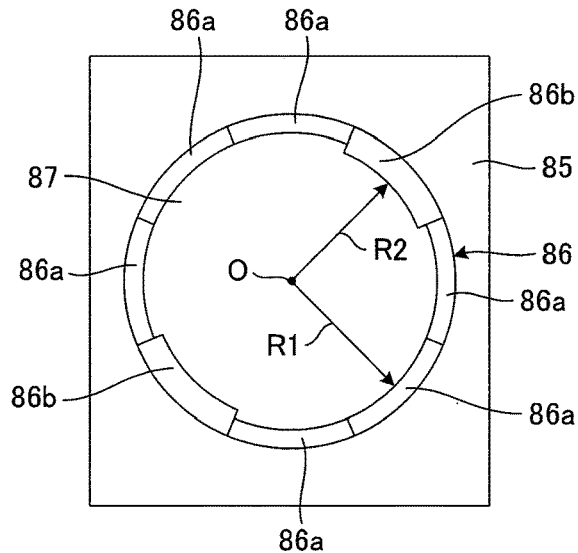
FIG. 11 is a schematic elevational view of an intermediate mask shown in FIG. 10.

Next, there will be explained a plating bath including an intermediate mask that can suppress the thickness of the plated metal layer of the portion on the substrate W in which the plated metal layer thickness is desired to be thin. FIG. 10 is a schematic side cross-sectional view of the copper plating unit 41 shown in FIG. 1, and FIG. 11 is a schematic elevational view of the intermediate mask shown in FIG. 10.

As shown in FIG. 10, the copper plating unit 41 has: a plating bath 80 configured to house the substrate holder 50 that holds the substrate W, and an anode holder 82 that holds an anode 82a; a plating power source 84 that applies voltage to the substrate W and the anode 82a; an intermediate mask 85 arranged between the substrate W and the anode 82a; and a paddle 83 for stirring a plating liquid, the paddle 83 being arranged between the substrate W and the intermediate mask 85.

The intermediate mask 85 is a plate-shaped member, and has an edge part 86 that forms an opening 87 through which an electric field from the anode 82a to the substrate W is made to pass. In other words, the edge part 86 shields a part of the electric field from the anode 82a to the substrate W. As shown in FIG. 11, the edge part 86 is formed in a substantially annular shape as a whole. The edge part 86 is configured to be divided in a peripheral direction, and has one or more edge parts 86a (first edge parts, and they are six in FIG. 11) and one or more edge parts 86b (second edge parts, and they are two in FIG. 11). A distance R2 from an inner periphery of the edge part 86b to a center O of the opening 87 is smaller than a distance R1 from an inner periphery of the edge part 86a to the center O of the opening 87. Hereby, an electric field from the anode 82a to the substrate W shielded by the edge part 86b is larger than an electric field from the anode 82a to the substrate W shielded by the edge part 86a. Note that the edge part 86b is formed to protrude to an inside of the opening 87 in a radial direction with respect to the edge part 86a by a length not less than 1 mm and not more than 10 mm.

Since the part of the electric field from the anode 82a to the substrate W is shielded by the edge part 86b that has a relatively short distance to the center of the opening 87, a thickness of a plating film formed on a part on the substrate W shielded by the edge part 86b is thin compared with that of the other portion. Accordingly, the edge part 86b is provided at the intermediate mask 85 so that the edge part 86b shields a part of the electric field applied to the portion on the substrate W in which the plating film thickness is desired to be thin, whereby the thickness of the plating film of the portion on the substrate W in which the plating film thickness is desired to be thin can be suppressed, and eventually, in-surface uniformity of the metal layer thickness of the substrate W can be improved.

Figure 12:
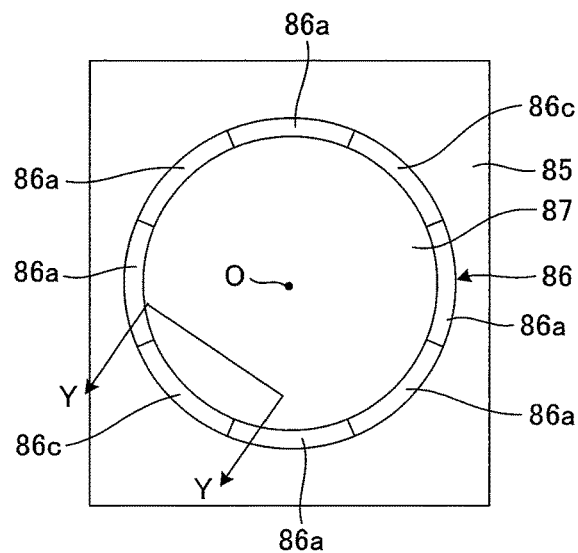
FIG. 12 is a schematic elevational view of an intermediate mask of the other mode.

Next, the intermediate mask 85 of the other mode according to the present invention will be explained. FIG. 12 is a schematic elevational view of the intermediate mask 85 of the other mode, FIG. 13 is one example of a schematic cross-sectional view of an edge part in a YY cross section of the intermediate mask 85 shown in FIG. 12, and FIG. 14 is another example of a schematic cross-sectional view of the edge part in the YY cross section of the intermediate mask 85 shown in FIG. 12.

As shown in FIG. 12, the edge part 86 that forms the opening 87 of the intermediate mask 85 is configured to be divided in a peripheral direction, and has the one or more edge parts 86a (first edge parts, and they are six in FIG. 12) and one or more edge parts 86c (second edge parts, and they are two in FIG. 12). A distance from an inner periphery of the edge part 86a of the intermediate mask 85 to the center O of the opening 87 shown in FIG. 12 is the same as a distance from an inner periphery of the edge part 86c to the center O of the opening 87. Meanwhile, as shown in FIG. 13, a thickness of the edge part 86c is formed to be thicker than a thickness of the edge part 86a, for example, in a range not less than 1 mm and not more than 5 mm. In other words, a distance from the edge part 86c to the substrate W is smaller than a distance from the edge part 86a to the substrate W in a state where the intermediate mask 85 is arranged in the plating bath 80 shown in FIG. 10. Hereby, since the distance (or an interval) between the substrate W and the edge part 86c becomes smaller than the distance between the substrate W and the edge part 86a, a thickness of a metal layer formed on a portion of the substrate W shielded by the edge part 86c is thin compared with that of the other portion. Accordingly, the edge part 86c is provided at the intermediate mask 85 so that the edge part 86c shields a part of an electric field applied to a portion on the substrate W in which the plated metal layer thickness is desired to be thin, whereby the thickness of the plated metal layer of the portion on the substrate W in which the plated metal layer thickness is desired to be thin can be suppressed, and eventually, in-surface uniformity of the metal layer thickness of the substrate W can be improved.

Figure 13:
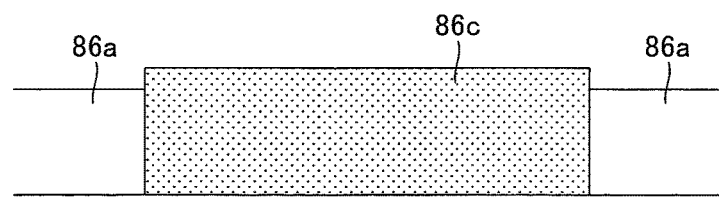
FIG. 13 is one example of a schematic cross-sectional view of an edge part in a YY cross section of the intermediate mask of FIG. 12.
Figure 14:
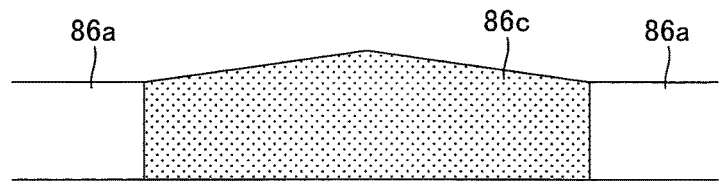
FIG. 14 is another example of a schematic cross-sectional view of the edge part in the YY cross section of the intermediate mask of FIG. 12.

Note that although a thickness of the edge part 86c of the intermediate mask 85 shown in FIG. 13 is uniform as a whole, the edge part 86c may be configured so that a cross-sectional shape of the edge part 86c of the intermediate mask 85 becomes a mountain shape toward a center as shown in FIG. 14. In addition, although in the intermediate mask 85 shown in FIG. 12, the distance from the inner periphery of the edge part 86a to the center O of the opening 87 is the same as the distance from the inner periphery of the edge part 86c to the center O of the opening 87, similarly to the intermediate mask 85 shown in FIG. 11, the intermediate mask 85 shown in FIG. 12 can also be configured so that the distance from the inner periphery of the edge part 86a to the center O of the opening 87 is different from the distance from the inner periphery of the edge part 86c to the center O of the opening 87.

Figure 15:
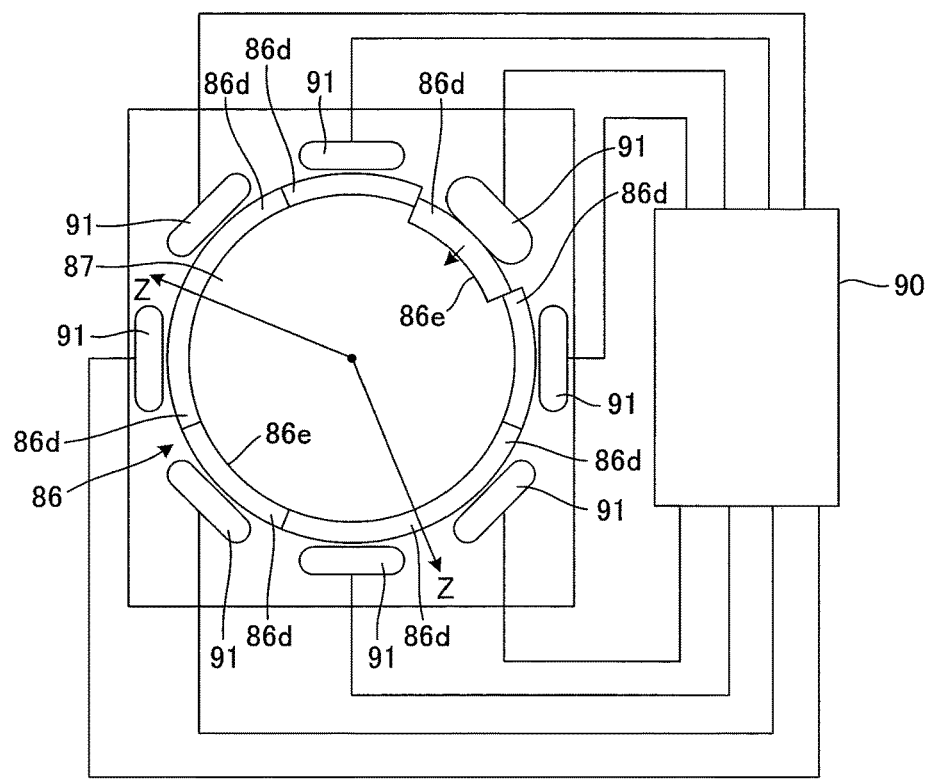
FIG. 15 is a schematic elevational view of an intermediate mask of a still other mode.
Figure 16:
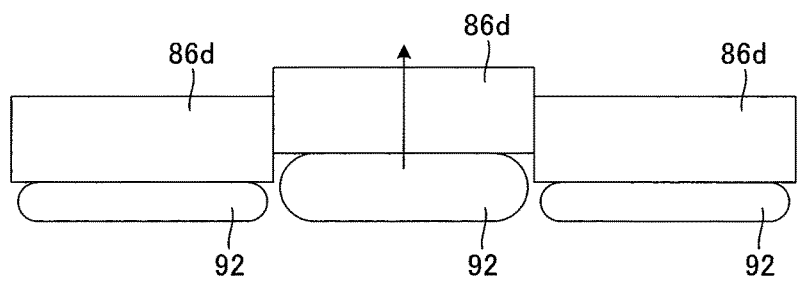
FIG. 16 is a schematic cross-sectional view of an edge part in a ZZ cross section of the intermediate mask of FIG. 15.

FIG. 15 is a schematic elevational view of the intermediate mask 85 of a still other mode, and FIG. 16 is a schematic cross-sectional view of an edge part in a ZZ cross section of the intermediate mask shown in FIG. 15. As shown in FIG. 15, the edge part 86 that forms the opening 87 of the intermediate mask 85 is divided in a peripheral direction, and includes a plurality of edge parts 86d. The plurality of edge parts 86d are configured to be movable in a radial direction of the opening 87. In addition, the plurality of edge parts 86d are configured to be movable to the substrate W in a state where the intermediate mask 85 is arranged in the plating bath 80 shown in FIG. 10.

The intermediate mask 85 further includes air bags 91 (i.e., drive mechanisms) corresponding to the respective edge parts 86d at an outside of the edge part 86 in a radial direction. The air bag 91 is configured to be able to be expanded and contracted by an air controller 90. When an inside of the air bag 91 is pressurized by the air controller 90, the air bag 91 expands to come into contact with the edge part 86d, and moves the edge part 86d to an inside of the opening 87 in a radial direction. When the air controller 90 returns a pressure of the inside of the air bag 91 to atmospheric pressure, the air bag 91 is contracted by an elastic force of the air bag 91 and a water pressure of a plating liquid. Simultaneously with this, the edge part 86d is moved to an original position by biasing means, such as a not-shown spring. Namely, the air bag 91 can move a position of an inner part 86e of the edge part 86d in the radial direction of the opening 87. The edge part 86d is moved toward the inside of the opening 87 in the radial direction by the air bag 91, for example, in a range not less than 1 mm and not more than 10 mm. Hereby, the edge part 86d moved to the inside of the opening 87 in the radial direction is included in a second edge part that shields the electric field from the anode 82a to the substrate W shown in FIG. 10 more than the other edge part 86d (or a first edge part). Note that the edge part 86d and the air bag 91 may be partially combined to directly move the edge part 86d by expansion and contraction of the air bag 91.

As shown in FIG. 16, the intermediate mask 85 includes air bags 92 (or drive mechanisms) corresponding to the respective edge parts 86d on a back surface side of the intermediate mask 85 (or an anode 82a side in the intermediate mask 85 shown in FIG. 10). The air bag 92 is configured to be able to be expanded and contracted by the air controller 90 shown in FIG. 15. When an inside of the air bag 92 is pressurized by the air controller 90, the air bag 92 expands to come into contact with the edge part 86d, and moves the edge part 86d to a front surface side (or a substrate W side in the intermediate mask 85 shown in FIG. 10) of the opening 87. When the air controller 90 returns a pressure of the inside of the air bag 92 to atmospheric pressure, the air bag 92 is contracted by an elastic force of the air bag 92 and a water pressure of a plating liquid. Simultaneously with this, the edge part 86d is moved to an original position of the intermediate mask 85 by biasing means, such as a not-shown spring. The edge part 86d moved to the substrate W shown in FIG. 10 by the air bag 92 is included in a second edge part that shields the electric field from the anode 82a to the substrate W more than the other edge part 86d (or a first edge part).

As explained in the above, in the intermediate mask 85 shown in FIGS. 15 and 16, the edge part 86 is configured to be divided, and the divided respective edge parts 86d are configured to be movable in the radial direction of the opening 87 by the air bags 91. Accordingly, the edge part 86d corresponding to the portion (for example, dies adjacent to a portion in which patterns are not formed on a resist) on the substrate W in which the plated metal layer thickness is desired to be thin can be moved to the inside in the radial direction. Hereby, since the portion on the substrate W in which the plated metal layer thickness is desired to be thin is partially covered with the edge part 86*d*, the thickness of the plating film of the portion on the substrate W in which the plated metal layer thickness is desired to be thin can be suppressed, and eventually, in-surface uniformity of the metal layer thickness of the substrate W can be improved. In addition, according to the intermediate mask 85, an area (an area that overlaps with the substrate W) in which the edge part 86*d* covers (shields) the substrate W can be adjusted. For this reason, since a shielding amount of the electric field applied to the substrate W in electrolytic plating can be adjusted, a region on the substrate W in which the plated metal layer thickness is made thin can be adjusted, and the plated metal layer thickness can be appropriately adjusted according to a type of the substrate W.

In addition, in the intermediate mask 85 shown in FIGS. 15 and 16, the edge part 86 is configured to be divided, and the divided respective edge parts 86*d* are configured to be movable to the substrate W shown in FIG. 10 by the air bags 92. Accordingly, the edge part 86*d* corresponding to the portion (for example, the dies adjacent to the portion in which the patterns are not formed on the resist) on the substrate W in which the plated metal layer thickness is desired to be thin can be moved to a side near the substrate W. Hereby, since a distance between the portion on the substrate W in which the plated metal layer thickness is desired to be thin and the edge part 86*d* becomes small, the metal layer thickness of the portion on the substrate W in which the plated metal layer thickness is desired to be thin can be made thin compared with that of the other portion, and eventually, in-surface uniformity of the layer thickness of the substrate W can be improved. In addition, according to the intermediate mask 85, since distances (or intervals) between the respective edge parts 86*d* and the substrate W can be independently adjusted, an amount of the electric field applied to portions of the substrate W corresponding to the respective edge parts 86*d* in electrolytic plating can be adjusted, and the plated metal layer thickness can be appropriately adjusted according the type of the substrate W.

Note that although the air bag 91 and the air bag 92 are used in FIGS. 15 and 16 as the drive mechanisms that move the edge part 86*d*, the present invention is not limited to this, and a drive mechanism, such as an actuator, may be used.

In addition, although the edge part 86 is configured to be divided into eight in the respective intermediate masks 85 shown in FIGS. 11 to 16, the present invention is not limited to this, and the edge part 86 may just be divided into not less than four and not more than twenty-four. This is because selectivity of a shielded region deteriorates if the number of divisions is less than four, and influence of one divided edge part 86 is too small if the number of divisions is not less than twenty-five, which makes adjustment complicated.

Figure 17:
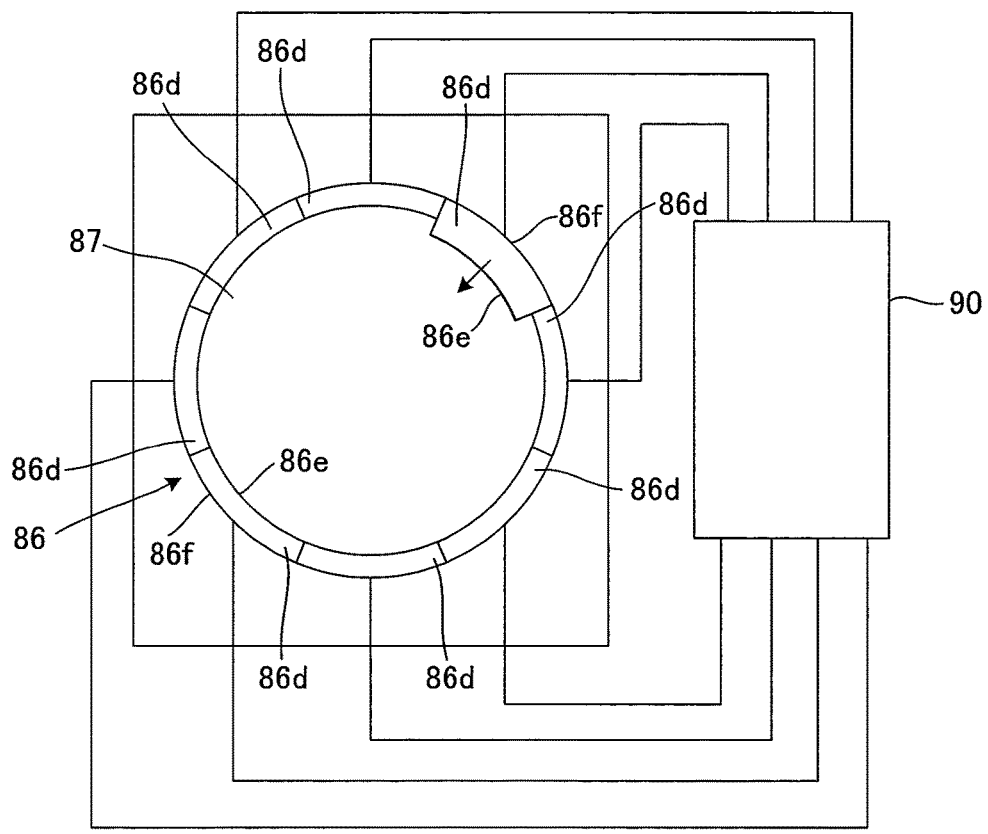
FIG. 17 is a schematic elevational view of an intermediate mask of a yet still other mode.
Figure 18:
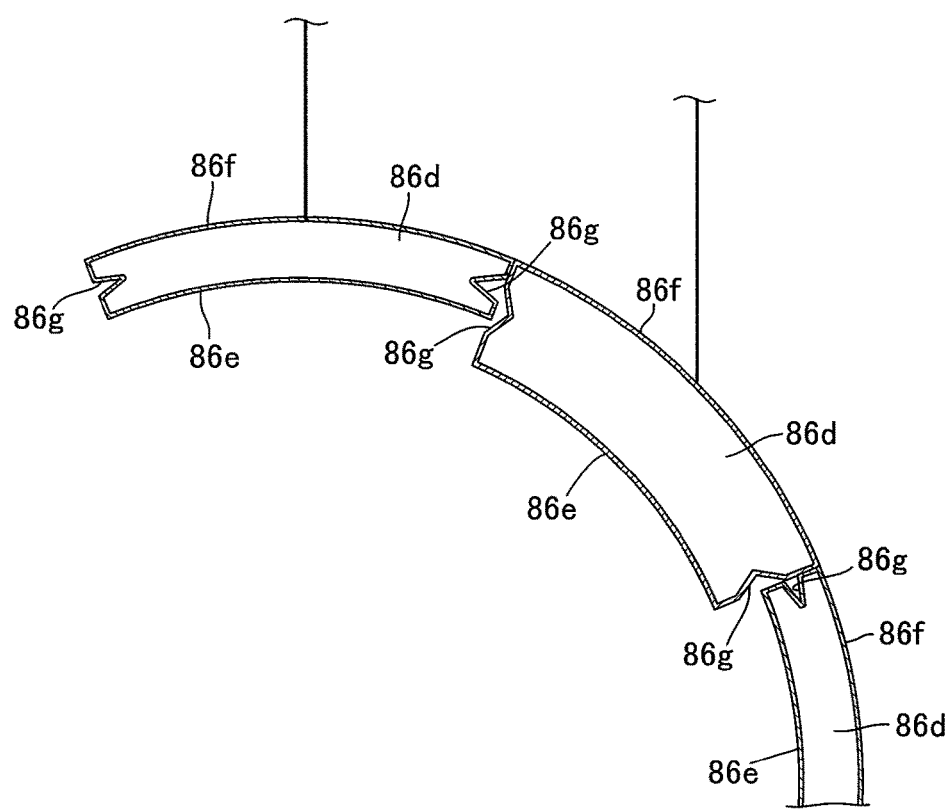
FIG. 18 is an enlarged cross-sectional view of an edge part of the intermediate mask of FIG. 17.

FIG. 17 is a schematic elevational view of an intermediate mask of a yet still other mode, and FIG. 18 is an enlarged cross-sectional view of an edge part of the intermediate mask of FIG. 17. Unlike the intermediate mask 85 shown in FIG. 15, in the intermediate mask 85 shown in FIG. 17, the plurality of edge parts 86*d* themselves include air bags. The edge part 86*d* is configured to be able to be expanded and contracted by the air controller 90 (or the drive mechanism). An outer part 86*f* of the edge part 86*d* is fixed to the intermediate mask 85. Hereby, when an inside of the edge part 86*d* is pressurized by the air controller 90, an inner part 86*e* of the edge part 86*d* moves to an inside of the opening 87 in a radial direction. When the air controller 90 returns a pressure of the inside of the edge part 86*d* to atmospheric pressure, the edge part 86*d* is contracted by an elastic force of the edge part 86*d*, and a water pressure of a plating liquid. The inner part 86*e* of the edge part 86*d* is configured to be movable toward the inside of the opening 87 in the radial direction, for example, in a range not less than 1 mm and not more than 10 mm. Hereby, the inner part 86*e* of the edge part 86*d* moved to the inside of the opening 87 in the radial direction is included in the second edge part that shields the electric field from the anode 82*a* to the substrate W shown in FIG. 10 more than the other edge part 86*d* (the first edge part).

As shown in FIG. 18, the edge part 86*d* has folded parts 86*g* at a surface in which the edge parts 86*d* are adjacent to each other. The folded parts 86*g* are developed by the inside of the edge part 86*d* being pressurized, and the inner part 86*e* of the edge part 86*d* moves toward the inside of the opening 87 in the radial direction. In addition, when a pressure of the inside of the edge part 86*d* is returned to atmospheric pressure, the folded parts 86*g* are folded again, and the inner part 86*e* of the edge part 86*d* moves toward an outside in the radial direction.

The intermediate mask 85 shown in FIGS. 17 and 18 exerts an effect similar to the intermediate mask 85 shown in FIG. 15. Note that the intermediate mask 85 shown in FIGS. 17 and 18 may include the air bags 92 shown in FIG. 16. Hereby, the edge part 86*d* can move also to the front surface side (the substrate W side in the intermediate mask 85 shown in FIG. 10) of the opening 87.

Next, a method for plating the substrate by the plating unit 41 shown in FIG. 10 will be explained. First, the anode 82*a* and the substrate W are stored in the plating bath 80 as shown in FIG. 10. At this time, the anode 82*a* and the substrate W are arranged so that respective surfaces thereof face to each other. Subsequently, the intermediate mask 85 is arranged between the anode 82*a* and the substrate W. Namely, the portion (for example, the dies adjacent to the portion in which the patterns are not formed on the resist) on the substrate W in which the plating film thickness is desired to be thin is shielded by the edge part 86*b* (as shown in FIG. 11), the edge part 86*c* (refer to FIG. 12), or the edge part 86*d* (as shown in FIG. 13) of the intermediate masks 85.

In a case of using the intermediate mask 85 of the mode shown in FIG. 11, the intermediate mask 85 is arranged so that the edge part 86*b* corresponds to the portion (for example, the dies adjacent to the portion in which the patterns are not formed on the resist) on the substrate W in which the plated metal layer thickness is desired to be thin. Specifically, when the substrate W is seen from the anode 82*a* side, the intermediate mask 85 is arranged so that the edge part 86*b* overlaps with the portion on the substrate W in which the plated metal layer thickness is desired to be thin. Hereby, the portion on the substrate W in which the plated metal layer thickness is desired to be thin is shielded by the edge part 86*b* of the intermediate mask 85.

In addition, in a case of using the intermediate mask 85 of the mode shown in FIG. 12, the intermediate mask 85 is arranged so that the edge part 86*c* corresponds to the portion (for example, the dies adjacent to the portion in which the patterns are not formed on the resist) on the substrate W in which the plating film thickness is desired to be thin. Specifically, when the substrate W is seen from the anode 82*a* side, the intermediate mask 85 is arranged so that the edge part 86*c* overlaps with the portion on the substrate W in which the plated metal layer thickness is desired to be thin. Hereby, the part of the electric field applied to the portion on the substrate W in which the plated metal layer thickness is desired to be thin is shielded by the edge part 86c of the intermediate mask 85.

Further, in a case of using the intermediate mask 85 of the mode shown in FIG. 15, the edge part 86d corresponding to the portion (for example, the dies adjacent to the portion in which the patterns are not formed on the resist) on the substrate W in which the plated metal layer thickness is desired to be thin is moved to the inside of the opening 87 in the radial direction by the air bag 91, and/or is moved to the side near the substrate W by the air bag 92. Hereby, the part of the electric field applied to the portion on the substrate W in which the plated metal layer thickness is desired to be thin is shielded by the edge part 86d of the intermediate mask 85 moved by the air bag 91 and/or the air bag 92.

Subsequently, the plating power source 84 applies an electric field between the anode 82a and the substrate W. At this time, the edge part 86a of any of the intermediate masks 85 shown in FIGS. 11 to 13 shields the electric field, and the edge part 86b shown in FIG. 11, the edge part 86c shown in FIG. 12, or the edge part 86d shown in FIG. 13 shields the electric field more than the edge part 86a. Hereby, the metal layer thickness of the portion on the substrate W in which the plated metal layer thickness is desired to be thin can be made thin compared with that of the other portion, and eventually, in-surface uniformity of the metal layer thickness of the substrate W can be improved.

Example 1

Figure 19:
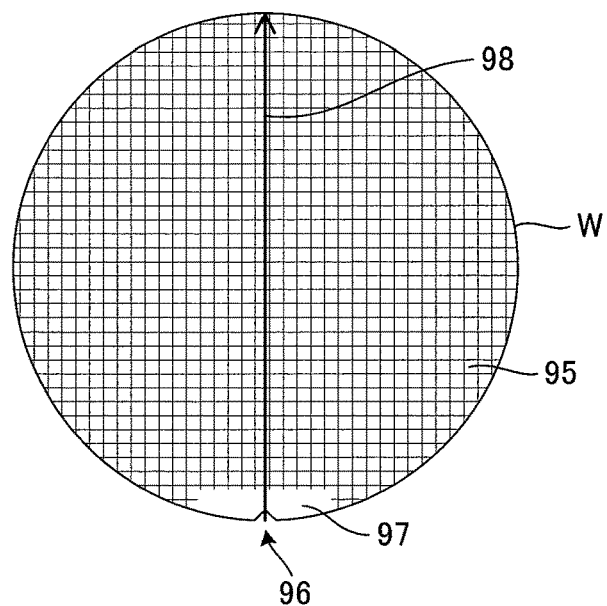
FIG. 19 is a schematic plan view of a substrate used for Example 1.

Hereinafter, the present invention will be explained in detail using Examples. FIG. 19 is a schematic plan view of a substrate used for Example 1. In Example 1, a resist layer with a thickness of 100 μm was formed on the substrate W including a silicon wafer, and a plurality of resist opening parts 95 each with a diameter of 100 μm were formed on the resist layer by a photolithography method. A portion 97 in which resist opening patterns were not formed was provided around a notch 96 of the substrate W. The substrate W was installed at the substrate holder 50 that has the shielding plate 65 shown in FIG. 2 etc. A tip of the shielding plate 65 at this time was configured to protrude from the inner peripheral surface of the seal holder 62 to the inside of the opening part 63 in the radial direction by 2 mm. The shielding plate 65 was moved on the seal holder 62 to coincide with the portion 97 around the notch 96 in which the resist opening patterns were not formed, and was fixed to the seal holder 62. The substrate W was housed in a plating bath in which a conventional intermediate mask in which an edge part was not divided was installed, and electroplating was performed so that a plating height of a resist opening part was 50 μm. Bump heights in dies of the electroplated substrate W were measured from the notch 96 to an opposite end of the substrate W toward a counter-notch direction (i.e., a direction from the notch 96 toward the center of the substrate W) as shown by an arrow 98 of FIG. 19.

As Comparative Example 1, electroplating was performed to the substrate W on the same conditions as Example 1 except for using a substrate holder in which the shielding plate 65 was not provided. Similarly, bump heights in dies of the substrate W were measured from the notch 96 to the opposite end of the substrate W toward the counter-notch direction as shown in the arrow 98 of FIG. 19.

Figure 20:
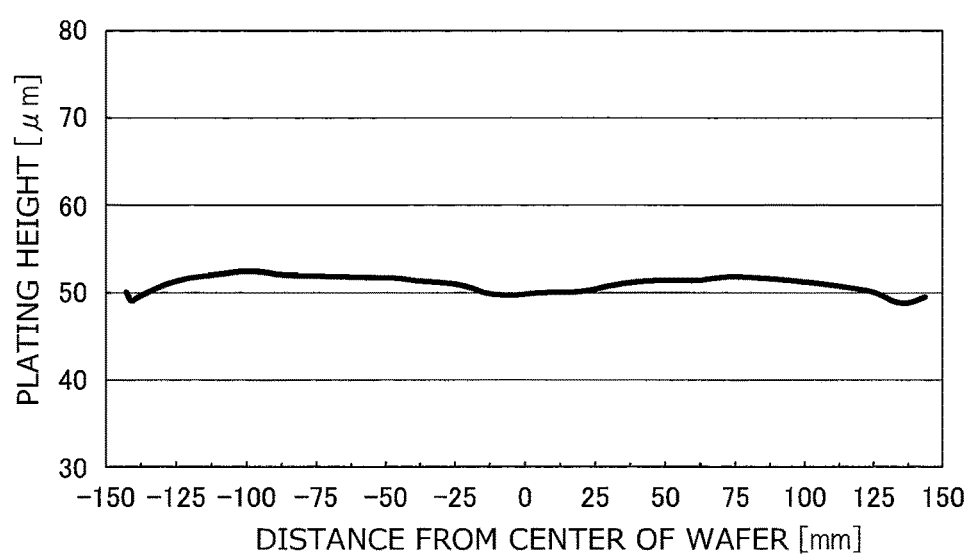
FIG. 20 is a graph showing a measurement result of Example 1.
Figure 21:
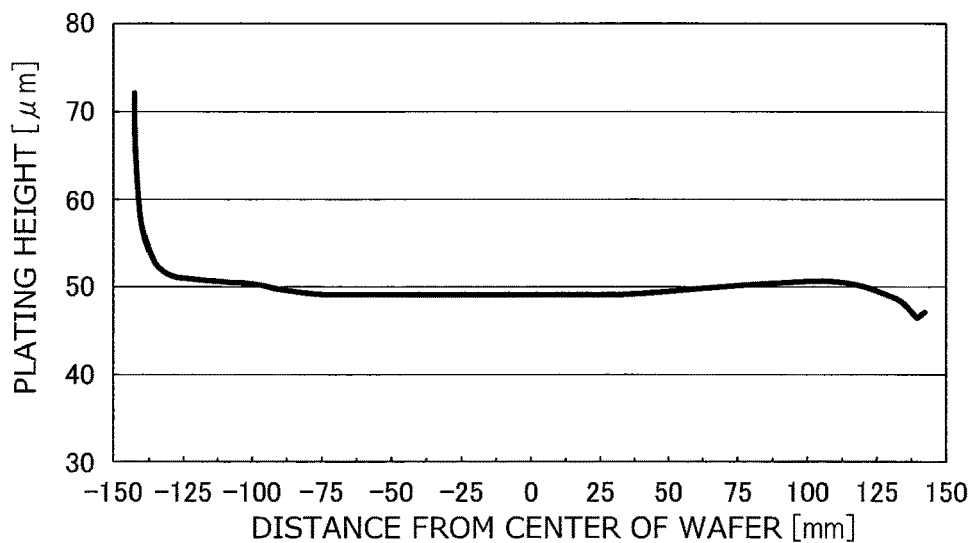
FIG. 21 is a graph showing a measurement result of Comparative example 1.

FIG. 20 is a graph showing a measurement result of Example 1, and FIG. 21 is a graph showing a measurement result of Comparative example 1. In the graphs of FIGS. 20 and 21, a horizontal axis indicates a distance (mm) from the substrate center, and a vertical axis indicates a plating height (μm), meaning a thickness (μm) of plated metal layer at the designated point. As shown in FIG. 21, in the measurement result of Comparative example 1, a plating height of the portion 97 of the substrate W in which the resist opening patterns are not formed is high compared with those of the other portions. In contrast with this, as shown in FIG. 20, in Example 1, it turns out that the shielding plate 65 shields the portion 97 in which the resist opening patterns are not formed, thereby the plating height of the portion 97 in which the resist opening patterns are not formed can be suppressed, and that a plating film is formed so that the uniformity of the plated metal layer is formed as a whole.

Example 2

Figure 22:
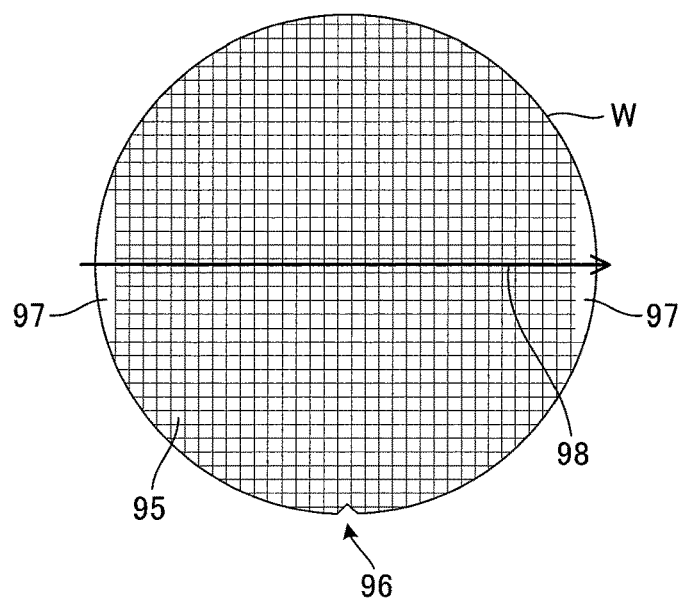
FIG. 22 is a schematic plan view of a substrate used for Example 2.

FIG. 22 is a schematic plan view of a substrate used for Example 2. In Example 2, a resist layer with a thickness of 100 μm was formed on the substrate W including a silicon wafer, and a plurality of resist opening parts 95 each with a diameter of 100 μm were formed on the resist layer by a photolithography method. As shown in FIG. 22, the substrate W has the portions 97 in which the resist opening patterns are not formed at positions of 90° and −90° when a position of the notch 96 is set to be 0°. The substrate W was installed at a conventional substrate holder not including the shielding plate 65. The intermediate mask 85 in which the edge part 86 shown in FIG. 11 was divided into the edge parts 86a and the edge parts 86b was housed in a plating bath in which the substrate W was treated. The edge parts 86b of the intermediate mask 85 were configured to protrude to the inside of the opening 87 in the radial direction with respect to the edge parts 86a by 4 mm, and were arranged to face the portions 97 of the substrate W in which the resist opening patterns were not formed. In the plating bath, electroplating was performed so that a plating height of a resist opening part of the substrate W was 50 μm. Bump heights in dies of the electroplated substrate W were measured from the one portion 97 in which the resist opening patterns were not formed to the other portion 97 in which the resist opening patterns were not formed, as shown in the arrow 98 of FIG. 22.

As Comparative example 2, electroplating was performed to the substrate W on the same conditions as in Example 2 except for using a conventional intermediate mask in which an edge part was not divided, instead of the intermediate mask 85 shown in FIG. 11. Similarly, bump heights in dies of the substrate W were measured from the one portion 97 in which the resist opening patterns were not formed to the other portion 97 in which the resist opening patterns were not formed, as shown in the arrow 98 of FIG. 22.

Figure 23:
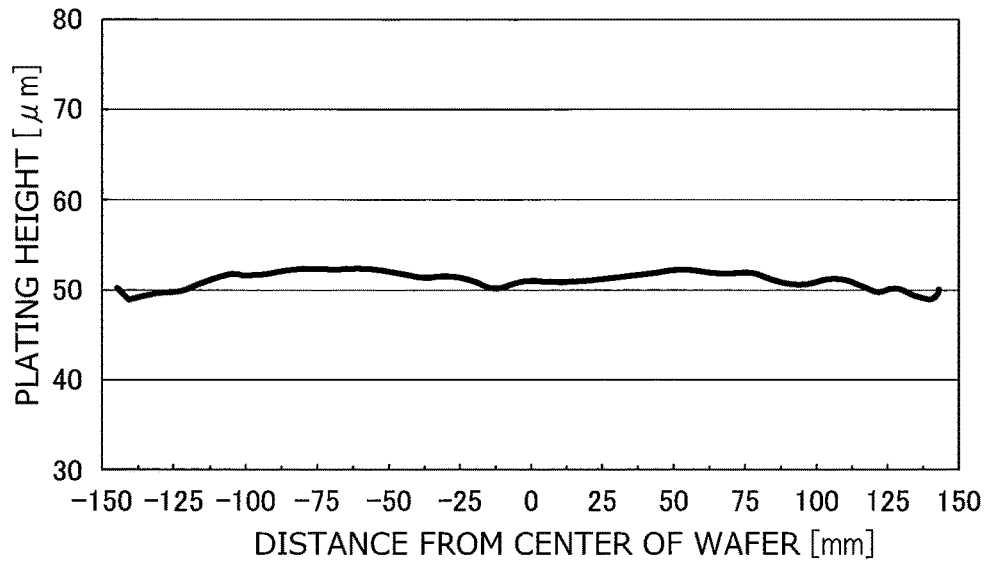
FIG. 23 is a graph showing a measurement result of Example 2.
Figure 24:
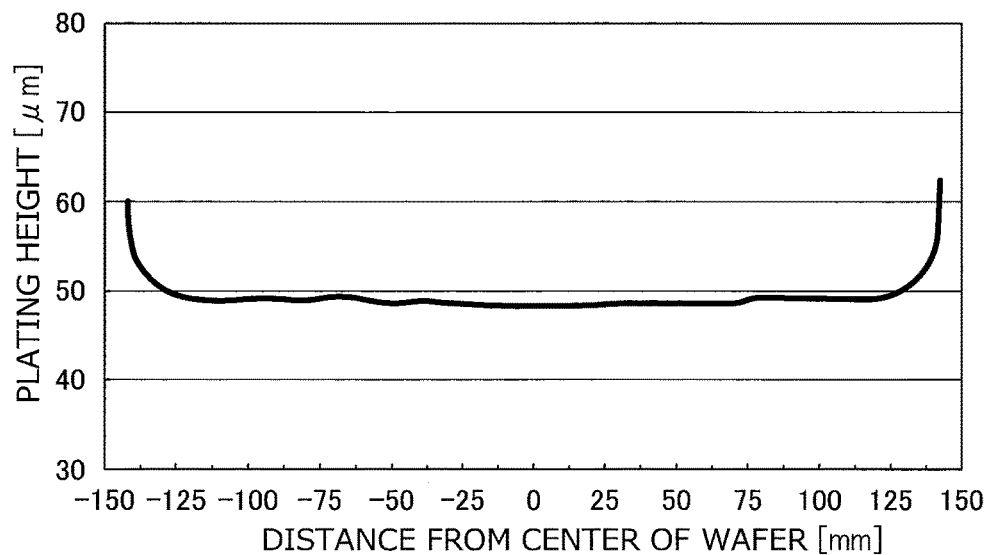
FIG. 24 is a graph showing a measurement result of Comparative example 2.

FIG. 23 is a graph showing a measurement result of Example 2, and FIG. 24 is a graph showing a measurement result of Comparative example 2. In the graphs of FIGS. 23 and 24, a horizontal axis indicates a distance (mm) from the substrate center, and a vertical axis indicates a plating height (μm). As shown in FIG. 24, in the measurement result of Comparative example 2, plating heights of the portions 97 of the substrate W in which the resist opening patterns are not formed are high compared with those of the other portions. In contrast with this, as shown in FIG. 23, in Example 2, it turns out that the edge parts 86b of the intermediate mask 85 shield the portions 97 in which the resist opening patterns are not formed, thereby the plating heights of the portions 97 in which the resist opening patterns are not formed can be suppressed, and that a plated metal layer is formed so that the plating height is uniform as a whole.

Table 1 shows uniformity of the bump heights formed on the substrate W in Example 1, Example 2, Comparative example 1, and Comparative example 2. Note that the uniformity of the bump height is a value obtained by calculating a formula of (a maximum height of the formed bumps−a minimum height of the formed bumps)/(an average value of the bump heights×2)×100.

TABLE 1

| Plating condition | Uniformity of bump height |
| --- | --- |
| Example 1 | 3.9% |
| Example 2 | 3.5% |
| Comparative example 1 | 25.2% |
| Comparative example 2 | 14.1% |

As shown in Table 1, in Example 1 that uses the substrate holder 50 having the shielding plate 65, since the heights of the bumps close to the portion 97 in which the resist opening patterns are not formed are suppressed, good uniformity is obtained. Meanwhile, in Comparative example 1 that uses the conventional substrate holder without the shielding plate 65, the heights of the bumps close to the portion 97 in which the resist opening patterns are not formed become high, and uniformity is bad, or not acceptable.

In addition, in Example 2 that uses the intermediate mask 85 having the divided edge part 86, since the heights of the bumps close to the portions 97 in which the resist opening patterns are not formed are suppressed, good (or acceptable) uniformity is obtained. Meanwhile, in Comparative example 2 that uses the conventional intermediate mask in which the edge part is not divided, the heights of the bumps close to the portions 97 in which the resist opening patterns are not formed become high, and uniformity is bad, or not acceptable.

Hereinbefore, although the embodiment of the present invention has been explained, the above-mentioned embodiment of the present invention is for facilitating understanding of the present invention, and it does not limit the present invention. It is needless to say that the present invention can be changed and improved without departing from the spirit thereof, and that the equivalents are included in the present invention. In addition, arbitrary combinations or omissions of each component described in claims and the specification can be made in a range that can solve at least a part of the above-mentioned problems, or a range that exerts at least a part of the effects.

REFERENCE SIGNS LIST

50 substrate holder
60 second holding member
63 opening part
63a edge
65 shielding plate
65a protruding part
65b tapered surface
65c curved tapered surface
66 groove
82a anode
85 intermediate mask
87 opening
86, 86a, 86b, 86c, and 86d edge part
91 and 92 air bag
300 substrate holder attaching/detaching device
W substrate

What is claimed is:

1. An apparatus for plating a substrate, comprising:
a plating bath configured to house the substrate and an anode; and
an intermediate mask arranged between the substrate and the anode, wherein
the intermediate mask has a plate-shaped member having an opening through which an electric field from the anode to the substrate is made to pass and a plurality of edge parts that form the opening, and wherein
the apparatus further includes a drive mechanism configured to move each of the edge parts in a direction toward the substrate in a state where the plate-shaped member is fixed to the plating bath.

2. The apparatus according to claim 1, wherein the opening is formed in a substantially annular shape as a whole by the edge parts.

3. The apparatus according to claim 1, wherein the edge parts are arranged in a peripheral direction to form the opening.

4. The apparatus according to claim 1, wherein the drive mechanism comprises air bags.

* * * * *